(12) United States Patent
Kim et al.

(10) Patent No.: US 8,012,531 B2
(45) Date of Patent: Sep. 6, 2011

(54) SOLAR CELL AND METHOD FOR MANUFACTURING THE SAME, AND METHOD FOR FORMING IMPURITY REGION

(75) Inventors: Hyungseok Kim, Seoul (KR); Youngho Choe, Seoul (KR); Jaewon Chang, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 12/721,861

(22) Filed: Mar. 11, 2010

(65) Prior Publication Data

US 2010/0229925 A1 Sep. 16, 2010

(30) Foreign Application Priority Data

Mar. 11, 2009 (KR) .................. 10-2009-0020533

(51) Int. Cl.
*B05D 5/12* (2006.01)
*B05D 3/02* (2006.01)
*H01L 31/00* (2006.01)

(52) U.S. Cl. .......... 427/75; 427/379; 427/554; 136/256; 136/262

(58) Field of Classification Search .............. 427/74–75, 427/372.2, 379, 554; 136/25
See application file for complete search history.

(56) References Cited

U.S. PATENT DOCUMENTS

| 6,552,414 B1 * | 4/2003 | Horzel et al. ................. 257/655 |
| 2003/0203603 A1 | 10/2003 | Meier et al. |
| 2010/0059109 A1 * | 3/2010 | Nakayashiki et al. ........ 136/255 |
| 2010/0240172 A1 * | 9/2010 | Rana et al. ...................... 438/96 |

FOREIGN PATENT DOCUMENTS

| JP | 5-75149 A | 3/1993 |
| JP | 7-135329 A | 5/1995 |
| JP | 2005-64014 A | 3/2005 |
| JP | 2005-136081 A | 5/2005 |

* cited by examiner

*Primary Examiner* — James Lin
(74) *Attorney, Agent, or Firm* — Birch, Stewart, Kolasch & Birch, LLP

(57) ABSTRACT

Disclosed is a method for manufacturing a solar cell. The method includes forming an impurity layer on a substrate of a first conductive type, the impurity layer having impurities of a second conductive type opposite the first conductive type; forming a first emitter portion having a first impurity concentration in the substrate using the impurity layer by heating the substrate with the impurity layer; forming a second emitter portion having a second impurity concentration at the first emitter portion using the impurity layer by irradiating laser beams on a region of the impurity layer, the second impurity concentration being greater than the first impurity concentration; and forming a first electrode connected to the second emitter portion and a second electrode connected to the substrate.

12 Claims, 6 Drawing Sheets

SOLAR CELL AND METHOD FOR MANUFACTURING THE SAME, AND METHOD FOR FORMING IMPURITY REGION

CROSS-REFERENCE TO RELATED APPLICATION

This application claims priority to and the benefit of Korean Patent Application No. 10-2009-0020533 filed in the Korean Intellectual Property Office on Mar. 11, 2009, the entire contents of which are incorporated herein by reference.

BACKGROUND OF THE INVENTION (a) Field of the Invention

Embodiments of the invention relate to a solar cell and a method for manufacturing the same, and a method for forming an impurity region of a solar cell.

(b) Description of the Related Art

Recently, as existing energy sources such as petroleum and coal are expected to be depleted, interests in alternative energy sources for replacing the existing energy sources are increasing. Among the alternative energy sources, solar cells generating electric energy from solar energy have been particularly spotlighted. A silicon solar cell generally includes a substrate and an emitter region, each of which is formed of a semiconductor, and a plurality of electrodes respectively formed on the substrate and the emitter region. The semiconductors forming the substrate and the emitter region have different conductive types, such as a p-type and an n-type. A p-n junction is formed at an interface between the substrate and the emitter region.

When light is incident on the solar cell, a plurality of electron-hole pairs is generated in the semiconductors. The electron-hole pairs are separated into electrons and holes by the photovoltaic effect. Thus, the separated electrons move to the n-type semiconductor (e.g., the emitter region) and the separated holes move to the p-type semiconductor (e.g., the substrate), The electrons and holes are respectively collected by the electrode electrically connected to the emitter region and the electrode electrically connected to the substrate. The electrodes are connected to one another using electric wires to thereby obtain electric power.

SUMMARY OF THE INVENTION

According to an aspect of the present invention, a method for forming an impurity region of a solar cell may include forming an impurity layer containing impurities on a substrate of a first conductive type; and diffusing the impurities into the substrate by irradiating laser beams on the impurity layer.

The forming of the impurity layer may form the impurity layer by using a screen printing method.

The forming of the impurity layer may form the impurity layer by using a sputtering method, an ink jetting method, a spin-on coating method, or a spraying method.

According to another aspect of the present invention, a method for manufacturing a solar cell may include forming an impurity layer on a substrate of a first conductive type, the impurity layer having impurities of a second conductive type opposite the first conductive type; forming a first emitter portion having a first impurity concentration in the substrate using the impurity layer by heating the substrate with the impurity layer; forming a second emitter portion having a second impurity concentration at the first emitter portion using the impurity layer by irradiating laser beams on a region of the impurity layer, the second impurity concentration being greater than the first impurity concentration; and forming a first electrode connected to the second emitter portion and a second electrode connected to the substrate.

An impurity doped depth of the second emitter portion may be different from an impurity doped depth of the first emitter portion.

The second emitter portion may be a line type or a dot type.

The forming of the impurity layer may form the impurity layer by using a screen printing method.

The forming of the impurity layer may form the impurity layer by using a sputtering method, an ink jetting method, a spin-on coating method, or a spraying method.

The impurity layer may be formed on an entire surface of the substrate.

The impurity layer may be formed on a portion of the substrate.

The method may further include removing the impurity layer after the forming of the second emitter portion.

According to another aspect of the present invention, a method for manufacturing a solar cell may include forming a first impurity layer and a second impurity layer on a substrate of a first conductive type, the first impurity layer containing impurities of a second conductive type opposite the first conductive type and the second impurity layer containing impurities of the first conductive type; forming a first impurity portion in a portion of the substrate on which the first impurity layer is formed and a second impurity portion in a portion of the substrate on which the second impurity layer is formed, by heating the substrate; forming a first high-doped impurity portion at the first impurity portion and having an impurity concentration higher than an impurity concentration of the first impurity portion by irradiating laser beams on a portion of the first impurity layer and a second high-doped impurity portion at the second impurity portion and having an impurity concentration higher than an impurity concentration of the second impurity portion by irradiating laser beams on a portion of the second impurity layer; and forming a first electrode connected to the first high-doped impurity portion and a second electrode connected to the second high-doped impurity portion.

The first impurity portion and the second impurity portion may be simultaneously formed.

The first high-doped impurity portion and the second high-doped impurity portion may be simultaneously formed.

According to another aspect of the present invention, a method for manufacturing a solar cell may include forming an impurity portion in a substrate of a first conductive type, the impurity portion having a second conductive type opposite the first conductive type; forming an impurity layer containing impurities of the second conductive type on a portion of the impurity portion; forming a high-doped impurity portion by injecting the impurities of the second conductive type into a region of the impurity portion, by irradiating laser beams on the impurity layer; and forming a first electrode connected to the high-doped impurity portion and a second electrode connected to the substrate.

The forming of the impurity layer may form the impurity layer by using a screen printing method.

The forming of the impurity layer may form the impurity layer by using a sputtering method, an ink jetting method, a spin-on coating method, or a spraying method.

According to another aspect of the present invention, a solar cell may include a substrate of a first conductive type; a first emitter portion positioned in the substrate and containing impurities of a second conductive type opposite the first conductive type; a second emitter portion positioned at the first emitter portion and containing impurities of the second conductive type, the second emitter portion having an impurity concentration higher than an impurity concentration of the first emitter portion; a first electrode connected to the second emitter portion; and a second electrode connected to the substrate, wherein the second emitter portion has a thickness equal to or less than a thickness of the first emitter portion.

According to another aspect of the present invention, a solar cell may include a substrate of a first conductive type; a first back surface field portion positioned in the substrate and containing impurities of the first conductive type; a second back surface field portion positioned at the first back surface field layer and containing impurities of the first conductive type, the second back surface field portion having an impurity concentration higher than an impurity concentration of the first back surface field portion; an emitter region positioned in the substrate and containing impurities of a second conductive type opposite the first conductive type; a first electrode connected to the emitter region; and a second electrode connected to the second back surface field portion.

According to another aspect of the present invention, a substrate of a first conductive type; a first back surface field portion positioned in the substrate and containing impurities of the first conductive type; a second back surface field portion positioned at the first back surface field portion and containing impurities of the first conductive type, the second back surface field portion having an impurity concentration higher than an impurity concentration of the first back surface field portion; a first emitter layer positioned in the substrate and having a second conductive type opposite the first conductive type; a second emitter portion positioned at the first emitter layer and containing impurities of the second conductive type, the second emitter portion having an impurity concentration higher than an impurity concentration of the first emitter portion; a first electrode connected to the second emitter portion; and a second electrode connected to the second back surface field portion.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
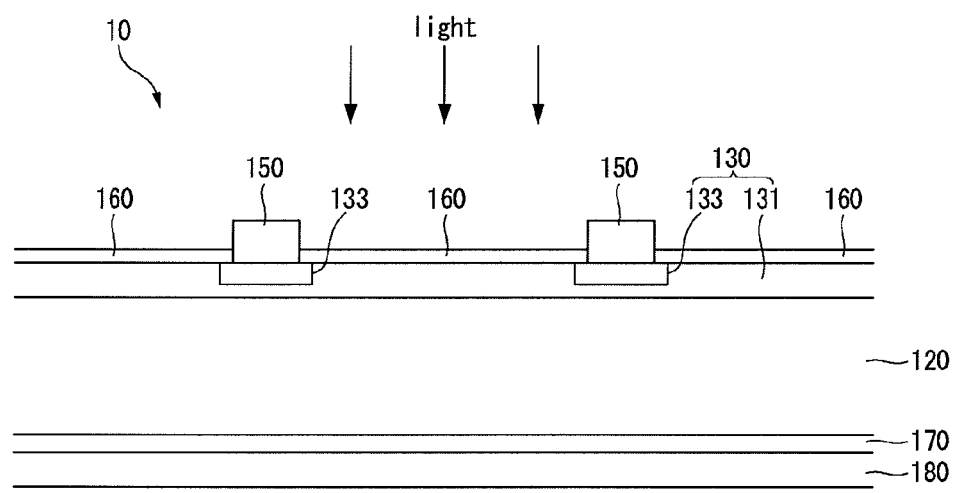
FIG. 1 is a partial cross-sectional view of a solar cell according to an example embodiment of the invention.

The invention will be described more fully hereinafter with reference to the accompanying drawings, in which example embodiments of the inventions are shown. This invention may, however, be embodied in many different forms and should not be construed as limited to only the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

First, a solar cell according to an example embodiment of the present invention will be described in reference to FIG. 1.

FIG. 1 is a partial cross-sectional view of a solar cell according to an example embodiment of the invention.

Referring to FIG. 1, a solar cell 10 according to an example embodiment of the invention includes a substrate 120, an emitter region 130 positioned in (at) a surface (hereinafter, referred to as 'a front surface') of the substrate 120 on which light is incident, an anti-reflection layer 160 on the emitter region 130, a plurality of front electrodes (first electrodes) 150 positioned on the front surface of the substrate 120 and connected to the emitter region 130, a rear electrode (second electrode) 180 positioned on a surface (a rear surface) of the substrate 120, opposite the front surface of the substrate 120, on which the light is not incident and connected to the substrate 120, and a back surface field (BSF) region 170 positioned between the substrate 120 and the rear electrode 180.

The substrate 120 is a semiconductor substrate formed of first conductive type silicon, for example, p-type silicon, though not required. Examples of silicon include crystalline silicon, such as single crystal silicon and polycrystalline silicon, and amorphous silicon. If the substrate 120 is of the p-type, the substrate 120 may contain impurities of a group III element such as boron (B), gallium (Ga), and indium (In). Alternatively, the substrate 120 may be of an n-type. If the substrate 120 is of the n-type, the substrate 120 may contain impurities of a group IV element such as phosphorus (P), arsenic (As), and antimony (Sb).

The front surface of the substrate 120 may be textured to form a textured surface corresponding to an uneven surface. Hence, a surface area of the substrate 120 increases and a light reflectance of the front surface of the substrate 120 is reduced. Hence, alight absorption increases and the efficiency of the solar cell 1 is improved.

The emitter region 130 is an impurity region with impurities (e.g., n-type impurities) of a second conductive type opposite the first conductive type of the substrate 120. The emitter region 130 is substantially positioned in (at) the entire surface, that is, the entire front surface of the substrate 120, on which light is incident. Thus, in this embodiment, the front surface functions as a light receiving surface.

The emitter region 130 includes a first emitter portion 131 and a plurality of second emitter portions 133. The first emitter portion 131 and the second emitter portions 133 have different impurity concentration from each other. In this embodiment, an impurity concentration (that is, an impurity doped concentration) of the second emitter portions 133 is heavier than that of the first emitter portion 131. In addition, an impurity doped depth of each second emitter portion 133 is less than that of the first emitter portion 131, and thereby a thickness of each second emitter portion 133 is less than that of first emitter portion 131. However, alternatively, the impurity doped depth of each second emitter portion 133 may be equal to or larger than that of the first emitter portion 131, and thereby a thickness of each second emitter portion 133 may be equal to or larger than that of first emitter portion 131. Each second emitter portion 133 may have a thickness of about 0.2 µm to about 2.0 µm from the surface of the substrate 120.

Since the impurity concentration of the second emitter portions 133 is heavier than that of the first emitter portions 131, the sheet resistance of the second emitter portion 133 is less than that of the first emitter portion 131.

The emitter region 130 forms a p-n junction with the substrate 120.

By a built-in potential difference generated due to the p-n junction, a plurality of electron-hole pairs, which are generated by incident light onto the semiconductor substrate 120, are separated into electrons and holes, respectively, and the separated electrons move toward the n-type semiconductor and the separated holes move toward the p-type semiconductor. Thus, when the substrate 120 is of the p-type and the emitter region 130 is of the n-type, the separated holes move toward the substrate 120 and the separated electrons move toward the emitter region 130.

Because the emitter region 130 forms the p-n junction with the substrate 120, when the substrate 120 is of the n-type, then the emitter region 130 is of the p-type, in contrast to the embodiment discussed above, and the separated electrons move toward the substrate 120 and the separated holes move toward the emitter region 130.

Returning to the embodiment, when the emitter region 130 is of the n-type, the emitter region 130 may be formed by doping the substrate 120 with impurities of the group V element such as P, As, Sb, etc., while when the emitter region 130 is of the p-type, the emitter region 130 may be formed by doping the substrate 120 with impurities of the group III element such as B, Ga, In, etc.

In reference to FIG. 1, the anti-reflection layer 160 positioned on the emitter region 130 is preferably made of silicon nitride (SiNx), etc. The anti-reflection layer 160 reduces reflectance of light incident onto the substrate 120 and increases selectivity of a specific wavelength band, thereby increasing efficiency of the solar cell 10. In this embodiment, the anti-reflection layer 160 has a single-layered structure, but the anti-reflection layer 160 may have a multi-layered structure such as a double-layered structure. The anti-reflection layer 160 may be omitted, if desired.

The plurality of front electrodes 150 are spaced apart from each other by a predetermined distance to be parallel to each other and extend in a direction on the second emitter portions 133 of the emitter region 130. The front electrodes 150 collect charges, for example, electrons, moving toward the emitter region 130.

At this time, a width of each of the front electrodes 150 is equal to or less than that of each of the underlying second emitter portions 133.

As described above, each second emitter portion 133 is in contact with the overlying front electrode 150, and thereby functions as an ohmic contact reducing the contact resistance with the front electrode 150.

The front electrodes 150 are preferably made of at least one conductive metal material. Examples of the conductive metal material may be at least one selected from the group consisting of nickel (Ni), copper (Cu), silver (Ag), aluminum (Al), tin (Sn), zinc (Zn), indium (In), titanium (Ti), gold (Au), and a combination thereof. Other conductive metal materials may be used.

The rear electrode 180 is positioned on the entire rear surface of the substrate 120 which is opposite to the light receiving surface, and is electrically connected to the substrate 120. The rear electrode 180 collects charges, for example, holes, moving toward the substrate 120.

The rear electrode 180 is preferably made of a conductive metal material. Examples of the conductive metal material may be at least one selected from the group consisting of Ni, Cu, Ag, Al, Sn, Zn, In, Ti, Au, and a combination thereof. Other conductive metal materials may be used.

The back surface field region 170 positioned between the rear electrode 180 and the substrate 120. The back surface field region 170 is an area heavily doped by impurities of the same conductive type as the substrate 120, and thereby, in this embodiment, the back surface field region 170 is an area of a $p^+$-type. A potential barrier is formed by an impurity concentration difference between the substrate 120 and the back surface field region 170, thereby distributing the movement of charges (for example, electrons) to a rear portion of the substrate 120. Accordingly, the back surface field region 170 prevents or reduces the recombination and/or the disappearance of the separated electrons and holes in the rear surface of the substrate 120.

An operation of the solar cell 10 of the structure will be described in detail.

When light irradiated to the solar cell 10 is incident on the substrate 120 of the semiconductor through the anti-reflection layer 160 and the emitter region 130, a plurality of electron-hole pairs are generated in the substrate 120 by light energy based on the incident light. At this time, since a reflection loss of light incident onto the substrate 120 is reduced by the anti-reflection layer 160, an amount of the incident light on the substrate 120 increases.

The electron-hole pairs are separated by the p-n junction of the substrate 120 and the emitter region 130, and the separated electrons move toward the emitter region 130 of the n-type and the separated holes move toward the substrate 120 of the p-type. The electrons that move toward the emitter region 130 are collected by the front electrodes 150 in contact with the second emitter portions 133, while the holes that move toward the substrate 120 are collected by the rear electrode 180. When the front electrodes 150 and the rear electrode 180 are connected with electric wires, current flows therein to thereby enable use of the current for electric power.

At this time, since the front electrodes 150 are directly in contact with the second emitter portions 133 heavily doped by the impurities of the n-type, for example, the contact power between the second emitter portions 133 and the front electrodes 150 improves, and thereby transmission efficiency of the charges (e.g., electrons) increases to improve efficiency of the solar cell 10.

Next, referring to FIGS. 2A to 2G, a method for manufacturing the solar cell 10 according to an example embodiment of the present invention.

FIGS. 2A to 2G are sectional views sequentially showing processes for manufacturing a solar cell according to an example embodiment of the present invention.

As described above, the first conductivity type is a p-type or n-type but, in this embodiment, it is assumed that the substrate 120 is a semiconductor substrate containing impurities of the p-type.

Figure 2A:
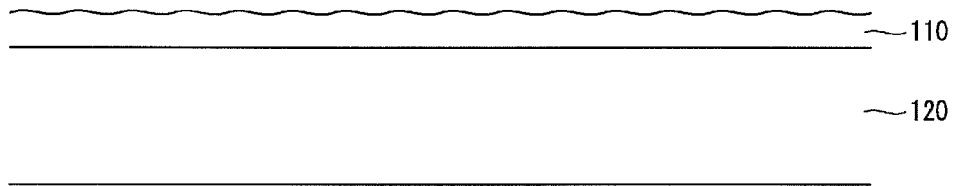
FIGS. 2A to 2G are sectional views sequentially showing processes for manufacturing a solar cell according to an example embodiment of the present invention.

As shown in FIG. 2A, a paste 110 for doping (hereinafter, referred to as "a doping paste") is applied on the substantially entire surface of the light receiving surface of the semiconductor substrate 120 in which the p-type impurities are doped, and then dried.

In this embodiment, the doping paste 110 contains P as the impurities (dopants), but may contain another impurities of a group V element such as As and Sn. In an alternative embodiment, when the substrate 120 is of the n-type, the doping paste 110 contains impurities of the p-type. In this case, the doping paste 110 contains impurities of a group III element such B etc.

In the embodiment, an impurity layer for doping such as the doping paste 110 is applied by a screen printing. However, alternatively, the impurity layer may be formed on the substrate 120 by using various manners such as a sputtering method, an ink jetting method, a spin-on coating method, a spraying method etc.

Before the printing of the doping paste 110 on the substrate 120, a saw damage removal process or a cleaning process etc., may be performed on the surface of the substrate 120 to remove damage portions that have occurred on the surface of the substrate 120 in slicing silicon for the substrate 120 and to thereby improve a surface state of the substrate 120. In addition, a texturing process may be performed to increase the amount of light incident onto the substrate 120.

Figure 2B:
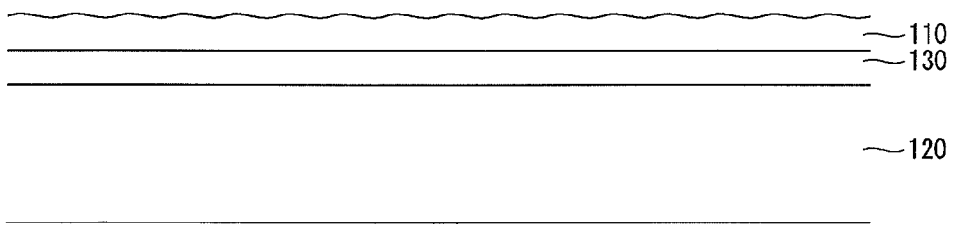

Next, as shown in FIG. 2B, by performing a heating process on the substrate 120 with the doping paste 110, the impurities of the n-type in the doping paste 110 are doped into the substrate 120 to form an emitter region 130 in (at) the front surface of the substrate 120.

That is, by heating the substrate 120 with the doping paste 110 in a furnace, the impurities of the n-type contained in the doping paste 110 are driven into the substrate 120 to form the emitter region 130 in (at) the substrate 120.

At this time, by adjusting the impurity concentration of the doping paste 110 and printing dimensions, the impurity concentration and dimensions of the emitter region 130 are controlled. Accordingly, the emitter region 130 having a predetermined impurity doped thickness is formed into the substrate 120 by using the doping paste 110 and the heat diffusion process described above.

In first performing the heating process diffusing the impurities of the n-type into the substrate 120, an oxidized substance containing the impurities such as P, for example, PSG (phosphorus silicate glass), may be grown on the surface of the substrate 120. Thus, after the heat diffusion process, the grown oxidized substance may be removed by etching using HF etc., to prevent or reduce an efficiency decrease of the solar cell 10 due to the oxidized substance.

Figure 2C:
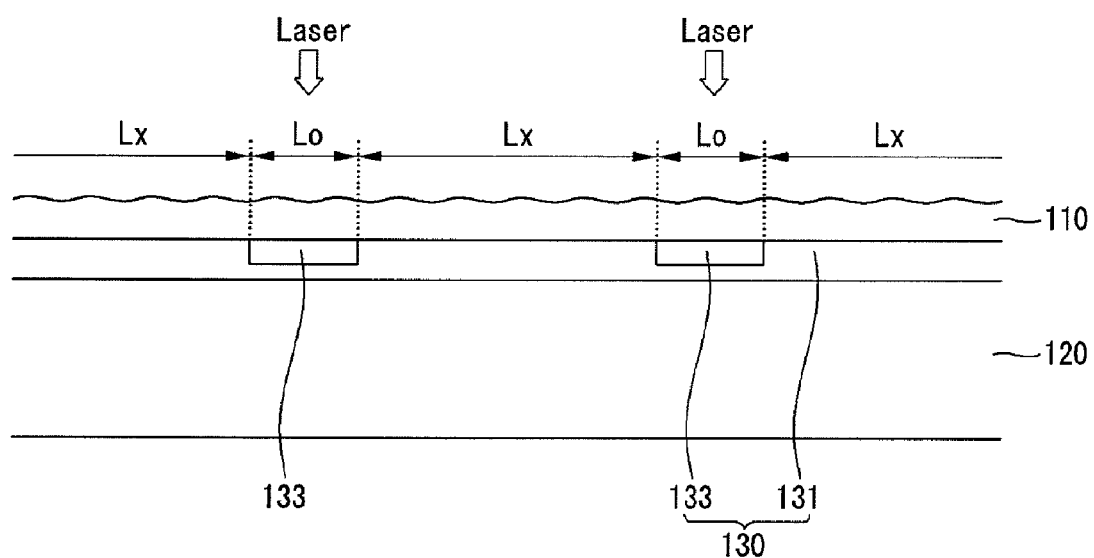

Next, referring to FIG. 2C, the doping paste 110 is secondly heated by irradiating laser beams on portions of the doping paste 110. At this time, the irradiation positions of the laser beams correspond to front electrode formation portions.

Thereby, regions of the impurity layer, that is, the doping paste 110, corresponding portions on which the laser beams are irradiated are heated, and thereby the n-type impurities of the heated regions are further driven into the substrate 120. Thus, portions Lo of the emitter region 130 corresponding to the laser beam irradiation regions are chanced into portions with the impurity concentration heavier than that of a portion Lx of the emitter region 130 formed through the first heating process. The portion Lx corresponds to a portion on which the laser beams are not irradiated. Accordingly, the emitter region 130 is divided into a first emitter portion 131 and a plurality of second emitter portions 133 having the different impurity concentration from each other, to complete the emitter region 130 with the first emitter portion 131 and the plurality of second emitter portions 133. As described above, the portions Lo corresponding to the laser beam irradiation regions is changed into the plurality of second emitter portions 133. In addition, since the impurity doping process is twice performed on the portions Lo, the plurality of second emitter portions 133 have the impurity concentration higher than that of the first emitter portion 131 corresponding to the portion Lx of the emitter region 130.

By the usage of the laser beams, since the doping paste 110 is partially or selectively heated to be capable of performing a selective thermal diffusion process, the impurity high-doping is realized only on desired portions, that is, the front electrode formation portions.

At this time, a shape of the second emitter portions 133 is defined by a laser beam irradiation shape. Thus, when the laser beams are irradiated on each region of the doping paste 110 in a continuous stripe shape, each of the emitter portions 133 formed in each of the front electrode formation portions has a continuous stripe shape. In this case, the number of second emitter portion 133 formed in each of the front electrode formation portions is singular. When the laser beams are discontinuously irradiated on each region of the doping paste 110 in a dotted shape, each of the emitter portions 133 formed in each of the front electrode formation portion has a dotted shape. In this case, the number of second emitter portions 133 formed in each the front electrode formation portion is plural.

Referring to FIG. 2C, an impurity doped depth of the first emitter portion 131 from the surface of the substrate 120 is greater than that of the second emitter portions 133. However, by controlling process conditions such as the irradiation intensity or the irradiation time of the laser beams, the impurity doped depth of the first emitter portion 131 is equal to or less than that of the second emitter portions 133.

As described, when forming the first and second emitter portions 131 and 133 using the thermal diffusion process and the laser beam irradiation, characteristics of the first and second emitter portions 131 and 133 such as the impurity doped depth and the sheet resistance are varied based on the process conditions such as the resistance of the substrate 120, the impurity concentration contained in the doping paste 110, the irradiation intensity, the irradiation time and so on.

For example, by adjusting the impurity concentration of the doping paste 110 and the temperature applied to the doping paste 110, the impurity concentration of the first and second emitter portions 131 and 133 may be controlled to be an optimum state.

When the impurity doped depth of the second emitter portions 133 is too shallow, the contact resistance with overlying first electrodes increases such that efficiency of precipitates, for example, the improvement of conductivity, is reduced. The precipitates are mainly formed in (at) the surface of the substrate 120 by the impurities of the doping paste 110 and silicon of the substrate 120.

The movement speed of charges is in inverse proportion to the impurity concentration. Thus, when the impurity doped depth of the second emitter portions 133 is too deep, the movement speed of charges is reduced. Thereby, time until the charges (e.g., electrons) moving toward the second emitter portions 133 to reach the front electrodes is prolonged so that they do not move to the front electrodes through the surface of the substrate 120, and the recombination and/or the disappearance of the electrons and holes increase. Thus, a collection probability of the charges is reduced to decrease the efficiency of the solar cell 10. Thereby, the emitter portions 133 may have a depth of about 0.2 μm to 2.0 μm.

Meanwhile, the impurity doped depth and the impurity concentration of the second emitter portions 133 may be defined by the sheet resistance, etc. The sheet resistance of the second emitter portions 133 may be varied by the process conditions. The sheet resistance of the second emitter portions 133 is less than that of the first emitter portion 131.

When the sheet resistance is too small, the surface concentration of P ions increases. Thus, there is a problem that the high-doped portions function as recombination sites, and thereby FSRV (front surface recombination velocity) increases and an open circuit voltage (Voc) decreases, to thereby reduce conversion efficiency of the solar cell 10. Meanwhile, when the sheet resistance is too large, the contact resistance with the front electrodes 150 increases and a fill factor (FF) decreases. Thereby, there is a problem that the efficiency of the solar cell 10 reduces. In considering the problems, in this embodiment, each second emitter portion 133 may have the sheet resistance of about 20 $\Omega/cm^2$ to 100 $\Omega/cm^2$.

Thereby, since when the plurality of second emitter portions 133 are formed by using the laser beams, the controlling of the dimensions of the laser irradiation portions Lo is easy, the controlling of the dimensions of the plurality of emitter portions 133 become also easy to form only as desired. Further, the temperature controlling of heated portions is realized by varying the output of the laser beams, and thereby the controlling of doped characteristics such as the impurity concentration and a profile etc., of the second emitter portion 133 becomes good or is improved.

Figure 2D:
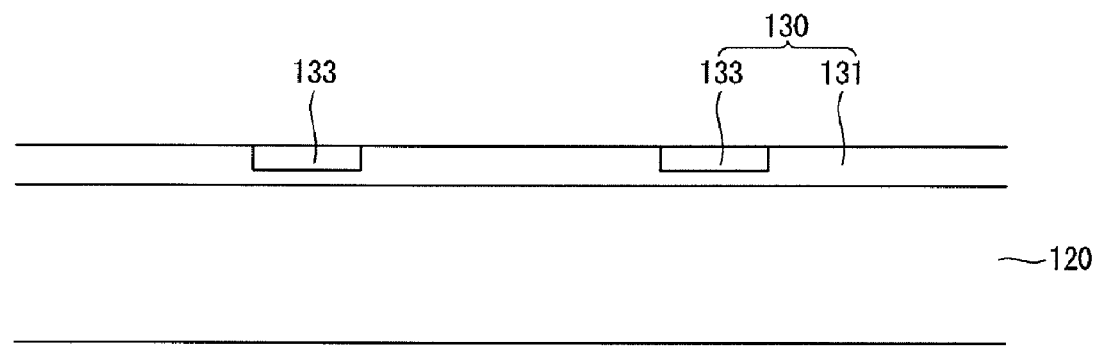

Next, referring to FIG. 2D, the doping paste 110 is removed. At this time, the doping paste 110 may be removed by an etching process, which does not influence the substrate 120 with the emitter region 130.

The manner of forming high-doped portions in (at) the emitter regions 130 by using the doping paste 110 and the laser beams is applicable to another example. For example, after forming the emitter region 130 in/on a substrate by a thermal diffusion manner using $POCl_3$ or $B_2H_6$ gas, doping paste or impurity layer may be formed only on desired portions for the emitter region by using a screen printing or various manners, and laser beams may be irradiated on the doping paste or impurity layer. Thereby, high-doped emitter portions (that is, the second emitter portion 133) may be formed in (at) the desired portions of the substrate 120.

Figure 2E:
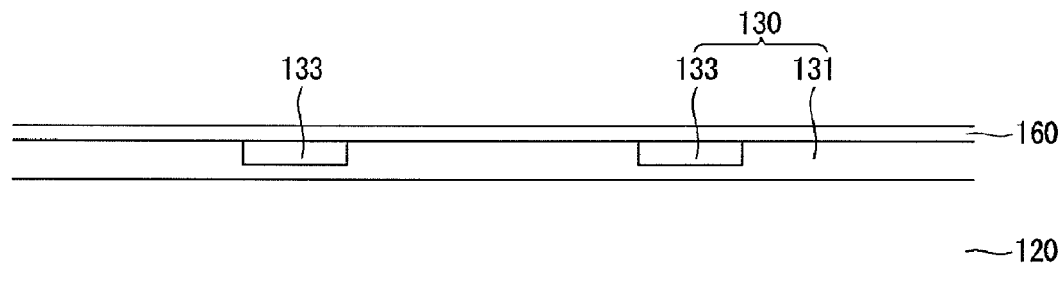

Next, referring to FIG. 2E, an anti-reflection layer 160 is formed on the emitter region 130. The anti-refection layer 160 reduces reflectance of incident light. The anti-reflection layer 160 may be preferably made of silicon nitride (SiNx), etc. The anti-reflection layer 160 may be formed by a plasma enhanced chemical vapor deposition (PECVD) method, a chemical vapor deposition (CVD) method, or a sputtering method.

Figure 2F:
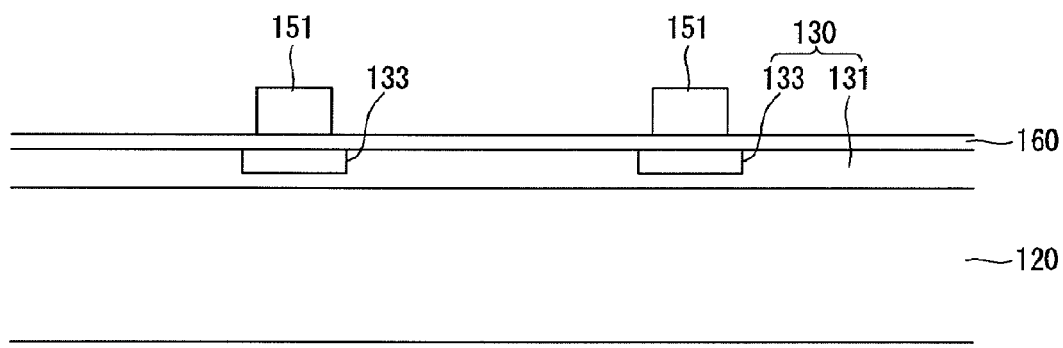

Next, referring to FIG. 2F, a front electrode paste is printed and dried on the anti-reflection layer 160 by using screen printing to form a front electrode pattern 151. At this time, the front electrode paste is formed on positions corresponding to the second emitter portions 133 of the emitter region 130. The front electrode paste preferably includes Ag and glass frits, though not required, and the glass frits include Pb, etc.

Figure 2G:
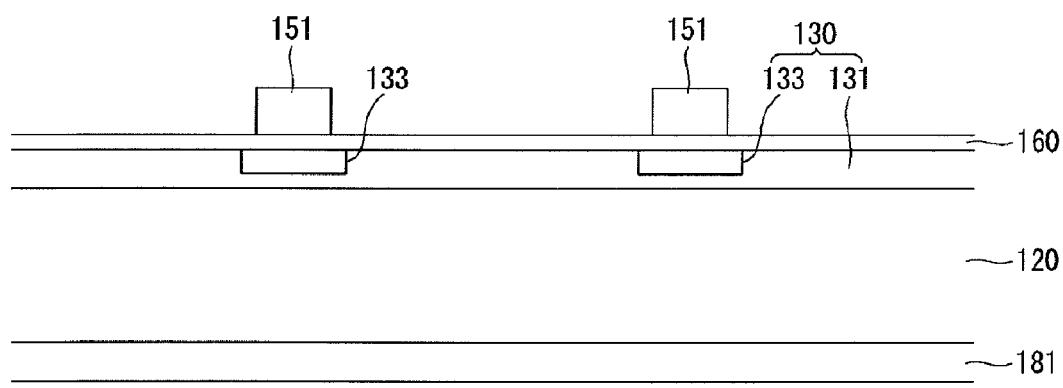

Next, referring to FIG. 2G, a rear electrode paste is printed and dried on a rear surface of the substrate 120 to form a rear electrode pattern 181.

At this time, the printing order of the front and rear electrode patterns may be changed.

Next, a heating process is performed on the substrate 120 with the front and rear electrode patterns to form a plurality of front electrodes 150 contacting with the second emitter portions 133 of the emitter region 130, a rear electrode 180 contacting with the substrate 120, and a back surface field (BSF) region 170. Accordingly, a solar cell 10 is completed shown in FIG. 1.

That is, by the heating process, the front electrode pattern 151 comes into contact with the second emitter portions 133 of the emitter region 130 by penetrating the anti-reflection layer 160 and the rear electrode pattern 181 is in contact with the substrate 120.

In addition, by the heating process, since Al included in the rear electrode paste is doped into the substrate 120, the back surface field region 170 is formed. The back surface field region 170 has an impurity concentration (p+) heavier than that of the substrate 120. As described above, the back surface field region 170 prevents or reduces the recombination of the electrons and the holes due to an impurity concentration difference between the back surface field region 170 and the substrate 120 and helps the movement of the holes toward the rear electrode 180.

Since the plurality of front electrodes 150 are in contact with only the plurality of emitter portions 133 having the higher impurity concentration and less sheet resistance than the first emitter portion 131, the contact characteristics between the front electrodes 150 and the second emitter portions 133 are improved. In addition, since the plurality of emitter portions 133 are formed on portions of the first emitter portion 131 on the surface of the substrate 120, charge loss due to life time shortening by highly doped impurities as well as contact resistance both decrease to improve the efficiency of the solar cell 10.

That is, when the second emitter portions 133 were further formed in (at) portions on which the first electrodes 150 are not positioned, impurities that are doped highly in (at) the surface of the substrate 120 exist in excessive amounts in the silicon of the substrate 120, and thereby precipitates were formed. Accordingly, the life time of the charges (carriers) was reduced to decrease the efficiency of the solar cell, due to the precipitates.

To solve the problems, the second emitter portions 133, that is, portions contacting with the first electrodes 150, have the impurity concentration heavier than the first emitter portion 131, that is, the remaining portion of the emitter region 130, and thereby the life time of the charges are prolonged.

In solar cell 10 of a selective-emitter structure obtained by partially and highly doping selective portions of the emitter region 130, the contact resistance between the first electrodes 150 and the emitter region 130 decreases, and disappearance of carriers, in particular, minority carriers is reduced.

In addition, since the front electrodes 150 include Ag, the front electrodes 150 have good electric conductivity, and since the rear electrode 180 includes Al having good affinity with silicon, the rear electrode 180 has good contact with the substrate 120 as well as good electric conductivity.

Next, referring to FIG. 3, a solar cell according to another example embodiment of the present invention will be described.

Figure 3:
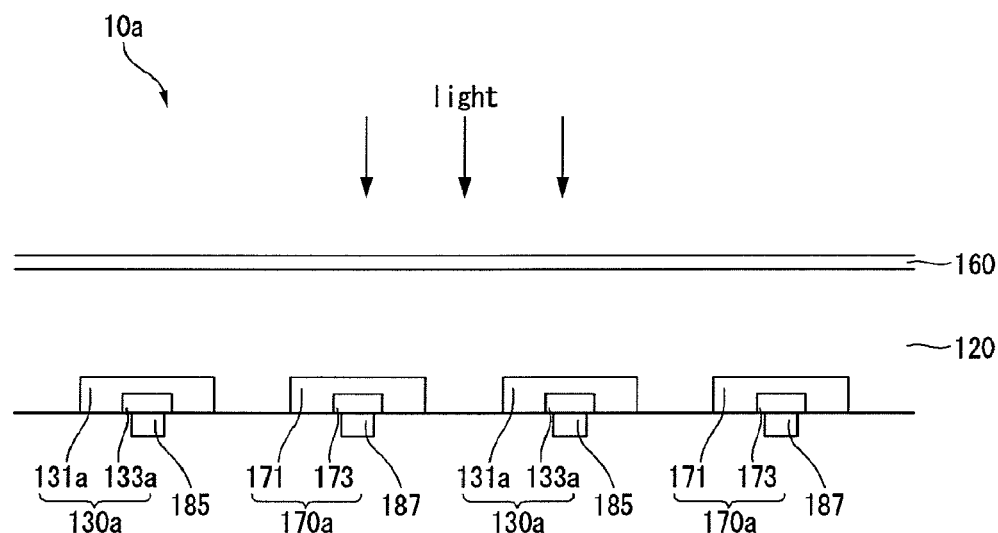
FIG. 3 is a partial cross-sectional view of a solar cell according to another example embodiment of the invention.

FIG. 3 is a partial cross-sectional view of a solar cell according to another example embodiment of the invention.

As compared with FIG. 1, the elements performing the same operations are indicated as the same reference numerals, and the detailed description thereof is omitted.

Referring to FIG. 3, a structure of a solar cell 10a according to this embodiment are almost the same as that shown in FIG. 1

That is, the solar cell 10a shown in FIG. 3 includes an anti-reflection layer 160 positioned on a front surface of a substrate 120, a plurality of first impurity portions 130a in (at) a rear surface of the substrate 120, a plurality of second impurity portions 170a positioned in (at) the rear surface of the substrate 120 and spaced apart from the first impurity portions 130a, a plurality of first electrodes 185 in contact with the plurality of first impurity portions 130a and a plurality of second electrodes 187 in contact with the plurality of second impurity portions 170a. The plurality of first impurity portions 130a function as emitter regions and the plurality of second impurity portions 170a function as back surface field regions.

Unlike the solar cell 10 of FIG. 1, the emitter regions 130a are partially or selectively positioned in (at) the rear surface of the substrate 120, instead of substantially the entire front surface of the substrate 120. Thereby, the number of emitter regions 130a is plural and extend in parallel in a predetermined direction in (at) the rear surface of the substrate 120. As described above, the plurality of emitter regions 130a are impurity portions doped with impurities of a conductive type opposite a conductive type of the substrate 120. Thus, the plurality of emitter regions 130a forms p-n junctions with the substrate 120.

As described in reference to FIG. 1, each of the emitter regions 130a includes a first emitter portion 131a and a second emitter portion 133a having different impurity concentrations, doped thicknesses and sheet resistances from each other. Like the solar cell 10 of FIG. 1, the impurity concentration of each second emitter portion 133a is more than that of the first emitter portions 131a, and the impurity doped thickness and the sheet resistance of the second emitter portion 133a are less than those of the first emitter portion 131a.

In addition, unlike the solar cell 10 of FIG. 1, the back surface field regions 170a are partially or selectively positioned in (at) the rear surface of the substrate 120, instead of substantially the entire rear surface of the substrate 120, and thereby, the number of back surface field regions 170a is plural. Further, the back surface field regions 170a are spaced apart from each other and extend in parallel to the emitter regions 130a in (at) the rear surface of the substrate 120. Hence, the first impurity regions 130a and the second impurity regions 170a are alternately positioned on the back surface of the substrate 120.

As described above, the plurality of back surface field regions 170a are impurity portions doped with impurities of a conductive type that is the same as a conductive type of the substrate 120. At this time, unlike the solar cell 10 of FIG. 1 but similar to each emitter region 130a, each back surface field region 170a includes a first back surface field portion 171 and a second back surface field portion 173 having different impurity concentrations, doped thicknesses and sheet resistances from each other.

The impurity concentration of the second back surface field portion 173 is more than that of the first back surface field portion 171, and the impurity doped thickness and the sheet resistance of the second back surface field portion 173 are less than that of the first back surface field portion 171.

Similar to the solar cell 10, each second emitter portion 133a and each second back surface field portion 173 of the solar cell 10a have a continuous line shape or a dot shape, respectively.

In addition, at least one of the each second emitter portion 133a and the each back surface field portion 173 may have a thickness of about 0.2 μm to about 2.0 μm from the surface of the substrate 120.

Thereby, since all of the plurality of emitter regions 130a and the plurality of back surface field regions 170a are positioned in (at) the rear surface of the substrate 120, the plurality of first electrodes 185 connected to the plurality of emitter regions 130a and the plurality of second electrodes 187 connected to the plurality of back surface field regions 170a are also positioned on the rear surface of the substrate 120.

That is, the plurality of first electrodes 185 is positioned on the plurality of emitter regions 130a, to contact the plurality of emitter regions 130a, respectively. The plurality of second electrodes 187 are positioned on the plurality of back surface field regions 170a, to contact the plurality of back surface field regions 170a, respectively.

At this time, each of the first electrodes 185 is connected to the second emitter portion 133a of each of the emitter regions 130a corresponding to the each first electrode 185, and each of the second electrodes 187 is connected to the second back surface field portion 173 of each of the back surface field regions 170a corresponding to the each first second electrode 187. Accordingly, the plurality of second emitter portions 133a and the plurality of second back surface field portions 173 function as ohmic contacts reducing the contact resistance with the overlying front electrodes 185 and the overlying second electrodes 187, respectively.

In the embodiment of the present invention, because the first electrodes 185 which would prevent light from being incident on the substrate 120 are positioned in (at) the rear surface of the substrate 120, an amount of light incident on the substrate 120 increases to improve efficiency of the solar cell 10a.

In addition, as described in reference to FIG. 1, since the first and second electrodes 185 and 187 are directly in contact with the second emitter portions 133a and the second back surface field portions 173, respectively, the contact between the second emitter and back surface field portions 133a and 173 and the first and second electrodes 185 and 187 increases to improve transmission efficiency of the charges to the first and second electrode 185 and 187.

In an alternative example, the solar cell 10a may further include a passivation layer positioned on at least one of the front and rear surface of the substrate 120. At this time, the passivation layer converts defects, such as a dangling bond, existing around the surfaces of the substrate 120 into stable bonds to thereby prevent or reduce a recombination and/or a disappearance of charges moving to the surfaces of the substrate 120, and thereby the efficiency of the solar cell 10a further improves.

Next, referring to FIGS. 4A to 4G as well as FIGS. 2A to 2G, a method for manufacturing the solar cell 10a according to another example embodiment of the present invention is described.

FIGS. 4A to 4G are sectional views sequentially showing processes for manufacturing a solar cell according to another example embodiment of the present invention.

Figure 4A:
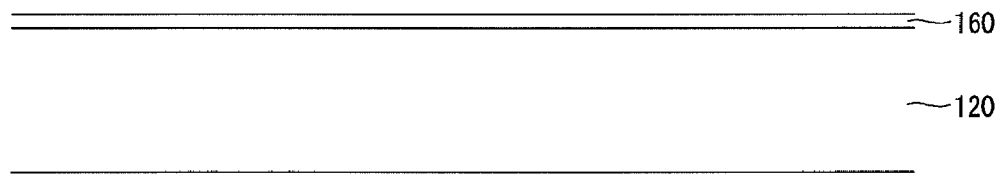
FIGS. 4A to 4G are sectional views sequentially showing processes for manufacturing a solar cell according to another example embodiment of the present invention.

First, referring to FIG. 4A, an ant-reflection layer 160 is formed on the substrate 120 like FIG. 2E.

Figure 4B:
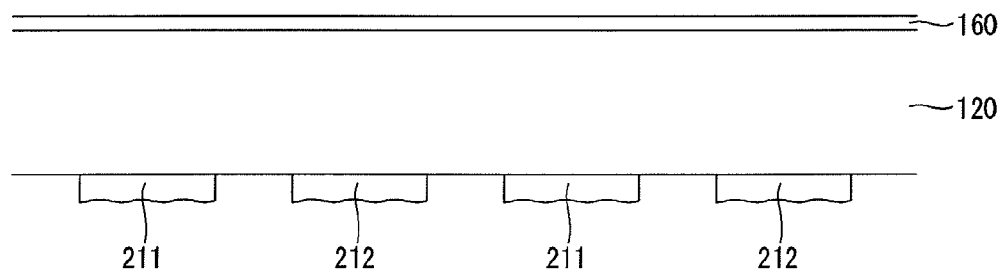

Next, a first doping paste 211 and a second doping paste 212 are formed in a predetermined distance on a rear surface, on which light is not incident, of the substrate 120 (FIG. 4B). The forming order of the first and second doping paste 211 may be changed.

The first and second doping pastes 211 and 212 have impurities of different conductive types from each other, respectively. In this embodiment, the first doping paste 211 contains impurities of a conductive type opposite that of the substrate 120 and the second doping paste 212 contains impurities of a conductive type that is the same to that of the substrate 120.

In FIG. 4B, the first and second doping pastes 211 and 212 are partially or selectively formed across the substrate 120 in parallel and are spaced apart from each other, but may partially or selectively be formed across the substrate 120 contacting with each other.

In the embodiment, the first and second doping pastes 211 and 211 are printed by screen printing using a screen mask with a predetermined pattern. As described above, in an alternative example, an impurity layer such as the first and second doping pastes 211 and 212 may be formed on the rear surface of the substrate 120 by using various methods such as a sputtering method, an ink jetting method, a spin-on coating method, or a spraying method.

In similar to prior described embodiment, before the formation of the first and second doping pastes 211 and 212, a saw damage removal process, a cleaning process, or a texturing process etc., may be performed on the substrate 120 to improve the efficiency of the solar cell 10a.

Figure 4C:
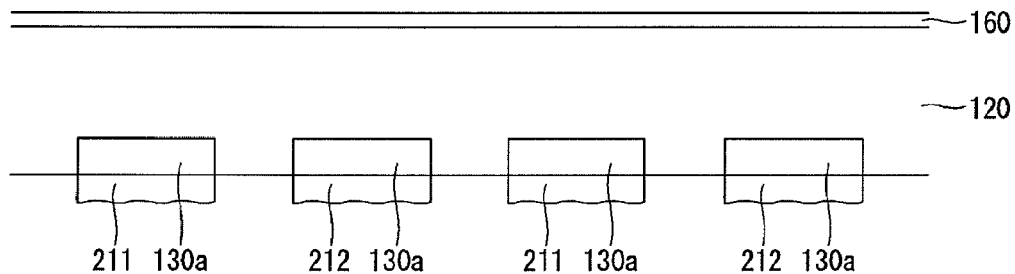

Next, like FIG. 2B, by performing a heating process on the substrate 120 with the first and second doping pastes 211 and 212, the impurities of the second conductive type contained in the first doping paste 211 are doped into the underlying regions of the substrate 120 and the impurities of the first conductive type contained in the second doping paste 212 are doped into the underlying regions of the substrate 120, to thereby form a plurality of emitter regions 130a and a plurality of back surface field regions 170a. At this time, the plurality of emitter regions 130a and the plurality of back surface field regions 170a are simultaneously formed (FIG. 4C). The formation positions of the plurality of emitter regions 130a correspond to the position of the first doping paste 211 and the formation positions of the back surface field regions 170a correspond to the position of the second doping paste 212.

At time, by adjusting the impurity concentration of the first and second doping pastes 211 and 212 and printing dimensions, the impurity concentration and dimensions of the plurality of emitter regions 130a and the plurality of back surface field regions 170a are controlled, respectively. In this case, an oxidized substance grown in the heating process for the first and second doping pastes 211 and 212 may be removed, Next, like FIG. 2C, by irradiating laser beams on portions of the first doping paste 211 and portions of the second doping paste 212, the portions of the first and second doping pastes 211 and 212 are secondarily heated. Thereby, a portion of each emitter region 130a is formed into a high-doped portion in which the impurity concentration is increased and a portion of each back surface field region 170a is formed into a high-doped portion in which the impurity concentration is increased.

Figure 4D:
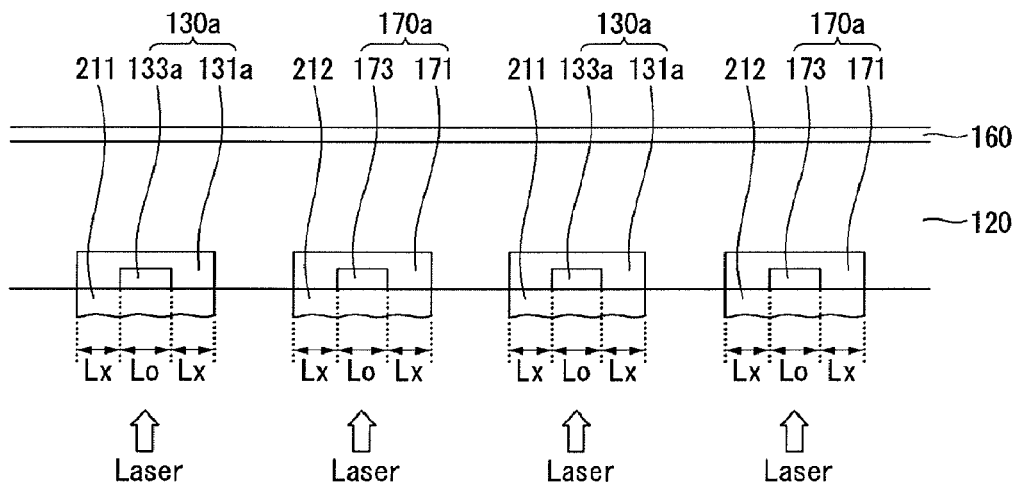

Accordingly, the plurality of emitter regions 130a include a plurality of first emitter portions 131a and a plurality of second emitter portions 133a with the different impurity concentrations to complete the plurality of emitter regions 130a, and the plurality of back surface field regions 170a include a plurality of first back surface field portions 171 and a plurality of second back surface field portions 173 with the different impurity concentrations to complete the plurality of back surface field regions 170a (FIG. 4D). Each second emitter portion 133a may have the sheet resistance of about 20 $\Omega/cm^2$ to 100 $\Omega/cm^2$.

At this time, the positions of the plurality of first emitter portions 131a and the plurality of first back surface field portions 171 correspond to portions Lx on which the laser beams are not irradiated, while the positions of the plurality of second emitter portions 133a and the plurality of second back surface field portions 173 correspond to portions Lo on which the laser beams are irradiated. In addition, the portions Lo correspond to first electrode formation positions and second electrode formation positions.

When the laser beams are simultaneously irradiated on the portions of the first and second doping pastes 211 and 212, the plurality of second emitter portions 133a and the plurality of second back surface field portions 173 are also simultaneously formed. At this time, shapes of each second emitter portion 133a and each second back surface field portion 173 are defined by an irradiation shape of the laser beams.

In the embodiment described above, by controlling the pattern formation of the doping pastes and the laser beam irradiation, the first and second emitter portions 131a and 133a and the plurality of first and second back surface field portions 171 and 173, which have the different impurity concentrations, respectively are formed.

However, by using the control of the pattern formation of the doping pastes and the laser beam irradiation according to this embodiment, emitter regions having substantially regular impurity concentration irrelative to positions and without the second emitter portions 133a may be formed, and back surface field regions having substantially regular impurity concentration irrelative to positions without the second back surface field portions 173 may be formed.

In this case, doping pastes are patterned and formed on the substrate, and at least one portion of the pattern of the doping paste is heated by laser beams, to form the emitter regions and the back surface field regions on the rear surface of the substrate 120. A shape of the doping paste is defined by a shape of the desired emitter region and/or the back surface field regions. Thereby, each emitter region has a substantially regular impurity concentration irrelative to positions and each back surface field region has a substantially regular impurity concentration irrelative to positions.

In addition, in case an emitter region is formed in (at) a front surface of a substrate and back surface field regions are partially or selectively formed in (at) a rear surface of the substrate, the pattern formation of the doping pastes and the laser beam irradiation may be adapted to the formation of the back surface field regions. For example, doping paste is patterned and formed on portions of the substrate, on which the formation portions of the back surface field regions correspond to, and then laser beams are irradiated on the doping paste to selectively form the back surface field regions on the rear surface of the substrate.

Similar to the description above, when forming high-doped portions in (at) the emitter regions 130a and the back surface field regions 170a by using the doping pastes 211 and 212 and the laser beams, after forming the emitter regions 130a and the back surface field layers 170a in/on a substrate by a thermal diffusion manner using $POCl_3$ or $B_2H_6$ gas, doping pastes or impurity layers may be formed only on desired portions for the emitter regions and the back surface field regions by using screen printing or various methods, and laser beams may be irradiated on the doping pastes or impurity layers. Thereby, high-doped back surface field portions (that is, the second back surface field portions 173) and high-doped emitter portions (that is, the second emitter portions 133a) may be formed in (at) the desired portions of the substrate 120.

The formation manner and the effect of the second emitter portions 133a and the second back surface field portions 173 are the same as the second emitter portions 133 described referring to FIG. 2C, and thereby the detailed description thereof is omitted.

As described referring to FIG. 2G, the control for an irradiation region or processing conditions of the laser beams is easy. Thus, when forming the second emitter portions 133a and the second back surface field portions 173, the second emitter portions 133a and the second back surface field portions 173 are formed only on desired regions and the control of doped characteristics such as the impurity concentration and a profile etc., of the second emitter portions 133a and the second back surface field portions 173 becomes good or improved.

Figure 4E:
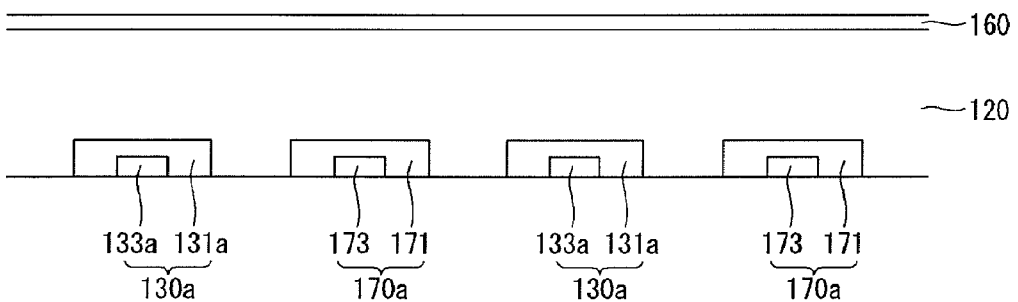
Figure 4F:
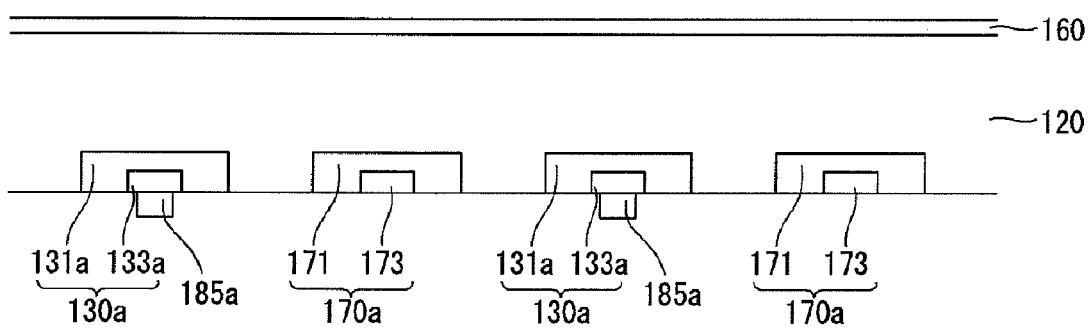

Next, referring to FIG. 4E, the first and second doping pastes 211 and 212 on the substrate 120 are removed.

Figure 4G:
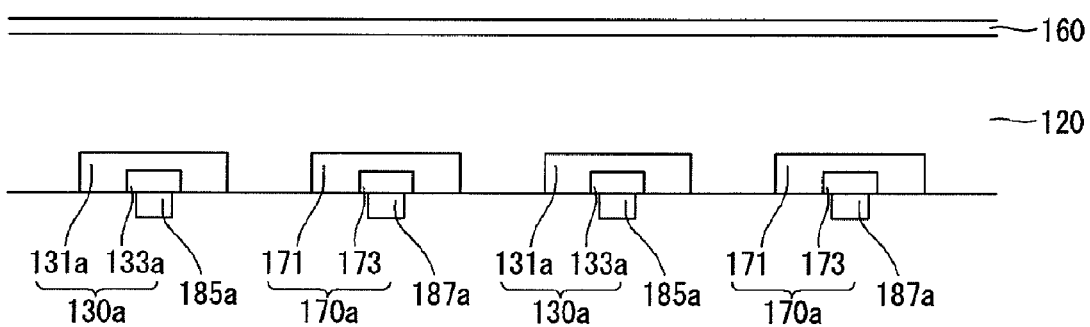

Next, like FIGS. 2F and 2G, a first electrode pattern 185a is formed on the second emitter portions 133a (FIG. 4F) and a second electrode pattern 187a is formed on the second back surface field portions 173 (FIG. 4G). The first electrode pattern 185a may not include Pb, and the first and second electrode pattern 185a and 187a may include Ag. The first electrode pattern 185a and the second electrode pattern 187a are formed only on the second emitter portions 133a and the second back surface field portions 173, respectively. The forming order of the first and second electrode patterns 185a and 187a may be changed.

Next, a heating process is performed on the substrate 120 to form a plurality of first electrodes 185 contacting with the plurality of second emitter portions 133a and a plurality of first electrodes 187 contacting with the plurality of second back surface field portions 187. Accordingly, a solar cell 10a is completed as shown in FIG. 3.

Since the second emitter portions 133a in which the impurities are highly doped as compared to the first emitter portions 131a are electrically connected to the first electrodes 185 and the second back surface field portions 173 in which the impurities are highly doped as compared to the first back surface field portions 171 are electrically connected to the second electrodes 187, the contact characteristics of the first and second electrodes 185 and 187 are improved to realize an ohmic contact. In addition, since only portions of the emitter regions 130a and the back surface field regions 170a are highly doped to form the high-doped portions 133a and 173, the lift time of carriers (charges) increases. Accordingly, efficiency of the solar cell 10a improves.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a solar cell, the method comprising:
    forming an impurity layer on a substrate of a first conductive type, the impurity layer having impurities of a second conductive type opposite the first conductive type;
    forming a first emitter portion having a first impurity concentration in the substrate using the impurity layer by heating the substrate with the impurity layer to diffuse the impurities into the substrate;
    forming a second emitter portion having a second impurity concentration at the first emitter portion using the impurity layer by irradiating laser beams on a region of the impurity layer to diffuse the impurities into the substrate, the second impurity concentration being greater than the first impurity concentration; and
    forming a first electrode connected to the second emitter portion and a second electrode connected to the substrate.

2. The method of claim 1, wherein an impurity doped depth of the second emitter portion is different from an impurity doped depth of the first emitter portion.

3. The method of claim 1, wherein the second emitter portion is a line type.

4. The method of claim 1, wherein the second emitter portion is a dot type.

5. The method of claim 1, wherein the forming of the impurity layer forms the impurity layer by using a screen printing method.

6. The method of claim 1, wherein the forming of the impurity layer forms the impurity layer by using a sputtering method, an ink jetting method, a spin-on coating method, or a spraying method.

7. The method of claim 1, wherein the impurity layer is formed on an entire surface of the substrate.

8. The method of claim 1, wherein the impurity layer is formed on a portion of the substrate.

9. The method of claim 1, further comprising removing the impurity layer after the forming of the second emitter portion.

10. A method for manufacturing a solar cell, the method comprising:
    forming a first impurity layer and a second impurity layer on a substrate of a first conductive type, the first impurity layer containing impurities of a second conductive type opposite the first conductive type and the second impurity layer containing impurities of the first conductive type;
    forming a first impurity portion in a portion of the substrate on which the first impurity layer is formed and a second impurity portion in a portion of the substrate on which the second impurity layer is formed, by heating the substrate to diffuse the respective impurities into the substrate;
    forming a first high-doped impurity portion at the first impurity portion and having an impurity concentration higher than an impurity concentration of the first impurity portion by irradiating laser beams on a portion of the first impurity layer and a second high-doped impurity portion at the second impurity portion and having an impurity concentration higher than an impurity concentration of the second impurity portion by irradiating laser beams on a portion of the second impurity layer to diffuse the respective impurities into the substrate; and
    forming a first electrode connected to the first high-doped impurity portion and a second electrode connected to the second high-doped impurity portion.

11. The method of claim 10, wherein the first impurity portion and the second impurity portion are simultaneously formed.

12. The method of claim 10, wherein the first high-doped impurity portion and the second high-doped impurity portion are simultaneously formed.

* * * * *